United States Patent
Uchiyama (10) Patent No.: US 10,692,883 B2
(45) Date of Patent: Jun. 23, 2020

(54) SEMICONDUCTOR MEMORY DEVICE

(71) Applicant: TOSHIBA MEMORY CORPORATION, Minato-ku, Tokyo (JP)

(72) Inventor: Yasuhiro Uchiyama, Yokkaichi Mie (JP)

(73) Assignee: TOSHIBA MEMORY CORPORATION, Tokyo (JP)

( * ) Notice: Subject to any disclaimer, the term of this patent is extended or adjusted under 35 U.S.C. 154(b) by 0 days.

(21) Appl. No.: 16/114,045

(22) Filed: Aug. 27, 2018

(65) Prior Publication Data
US 2019/0296037 A1  Sep. 26, 2019

(30) Foreign Application Priority Data

Mar. 20, 2018  (JP) .................................. 2018-052841

(51) Int. Cl.
*H01L 29/792* (2006.01)
*H01L 27/11582* (2017.01)
*H01L 27/1157* (2017.01)
*H01L 29/423* (2006.01)

(52) U.S. Cl.
CPC .... *H01L 27/11582* (2013.01); *H01L 27/1157* (2013.01); *H01L 29/4234* (2013.01)

(58) Field of Classification Search
CPC ................................................ H01L 27/11582
USPC ......................................................... 257/324
See application file for complete search history.

(56) References Cited

U.S. PATENT DOCUMENTS

| | | | |
|---|---|---|---|
| 9,117,700 B2 | 8/2015 | Oh et al. | |
| 9,786,679 B2 | 10/2017 | Fukuzumi et al. | |
| 2005/0196922 A1* | 9/2005 | Willer | H01L 27/105 438/257 |
| 2014/0043916 A1* | 2/2014 | Costa | G11C 16/14 365/185.25 |
| 2015/0255486 A1 | 9/2015 | Kameoka et al. | |
| 2016/0268279 A1* | 9/2016 | Uchiyama | H01L 27/11582 |

FOREIGN PATENT DOCUMENTS

| | | |
|---|---|---|
| JP | 2013-093577 A | 5/2013 |
| JP | 2015-170643 A | 9/2015 |
| JP | 2016-171280 A | 9/2016 |

* cited by examiner

*Primary Examiner* — Ajay Arora
(74) *Attorney, Agent, or Firm* — Foley & Lardner LLP (57) ABSTRACT

A semiconductor memory device includes a substrate; a stacked body on the substrate and including a first stacked body formed of stacked first electrode layers and a second stacked body on the first stacked body and including a second electrode layer; a hole passing through the stacked bodies in a first direction and having a first insulator, and a channel film between the first insulator and first electrode layers and between the first insulator and second electrode layer and having first and second portions facing each other, with the first insulator placed therebetween. A first memory between the first electrode layers and the first portion and a second memory between the first electrode layers and the second portion are insulated. A third memory between the second electrode layer and the first portion and a fourth memory between the second electrode layer and the second portion are connected.

16 Claims, 11 Drawing Sheets

SEMICONDUCTOR MEMORY DEVICE

CROSS-REFERENCE TO RELATED APPLICATIONS

This application is based upon and claims the benefit of priority from Japanese Patent Application No. 2018-052841, filed Mar. 20, 2018, the entire contents of which are incorporated herein by reference.

FIELD

Embodiments described herein relate generally to semiconductor memory devices.

BACKGROUND

As a semiconductor memory device, there is, for example, a three-dimensional semiconductor memory having a structure in which a stacked body formed of stacked word lines and selected gate lines is divided. In this three-dimensional semiconductor memory, a memory hole is formed in part of a division area. Furthermore, two memory cell films share this memory hole.

DETAILED DESCRIPTION

In the above-described semiconductor memory device, selected gate lines whose operation units are the same are divided, which may result in generation of a leakage current in the division area. In this case, there is a possibility of a reduction in product performance and reliability.

Embodiments disclosed herein provide a semiconductor memory device that can improve product performance and reliability.

In general, according to some embodiments, a semiconductor memory device includes a substrate; a stacked body that is provided on the substrate and includes a first stacked body which is formed of a plurality of stacked first electrode layers and a second stacked body which is provided on the first stacked body and includes at least one second electrode layer; a hole that passes through the first stacked body and the second stacked body in a first direction perpendicular to the substrate and has a first insulator; and a channel film that is located between the first insulator and the first electrode layers and between the first insulator and the second electrode layer and has a first portion and a second portion which face each other with the first insulator placed therebetween. A first memory unit that is located between the first electrode layers and the first portion and a second memory unit that is located between the first electrode layers and the second portion are electrically insulated, and a third memory unit that is located between the second electrode layer and the first portion and a fourth memory unit that is located between the second electrode layer and the second portion are electrically connected.

Hereinafter, certain embodiments will be described with reference to the drawings. These embodiments are provided by way of example rather than by way of limitation.

First Embodiment

Figure 1:
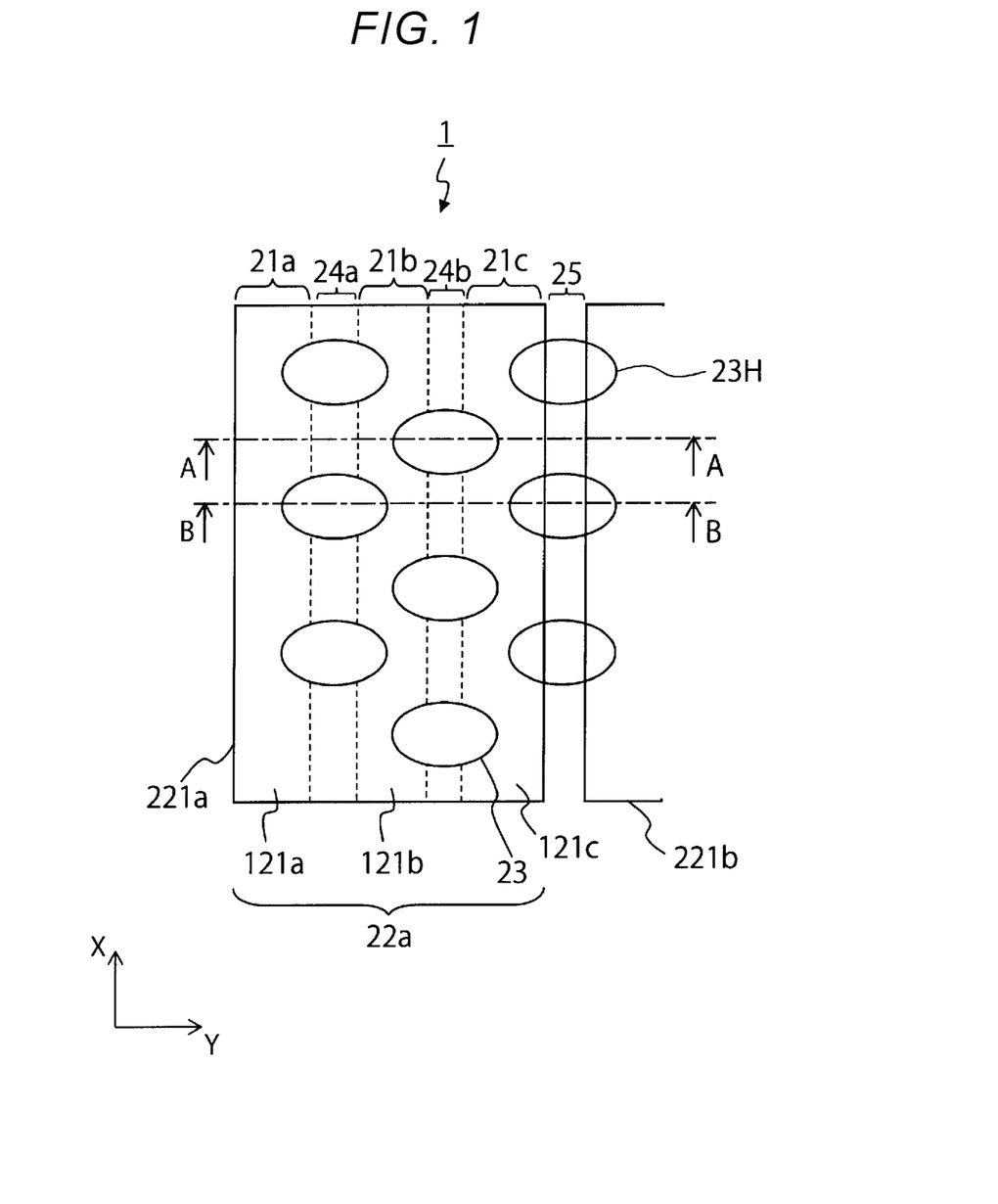
FIG. 1 is a schematic plan view of a semiconductor memory device according to a first embodiment.
Figure 2:
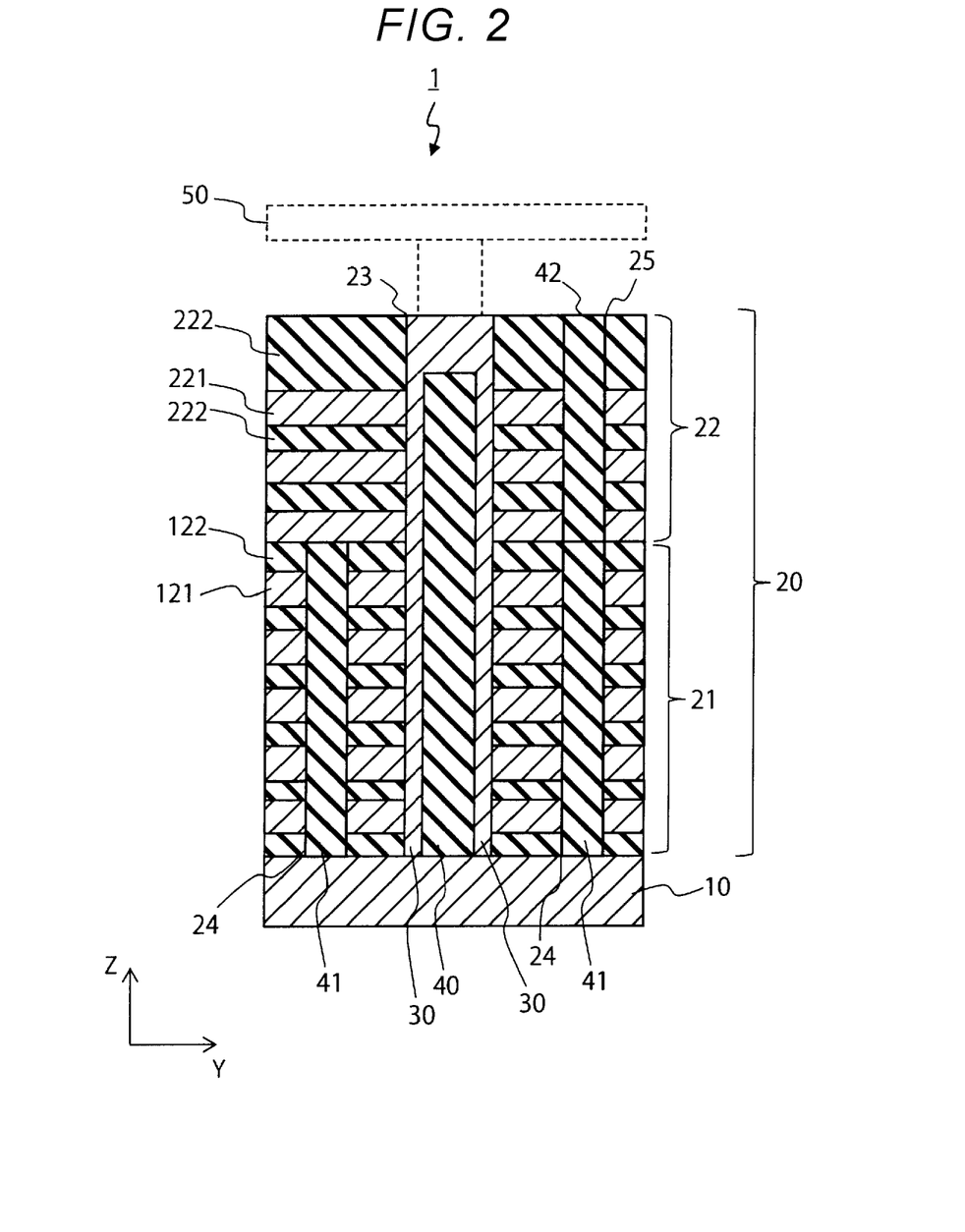
FIG. 2 is a sectional view taken along the cutting-plane line A-A depicted in FIG. 1.
Figure 3:
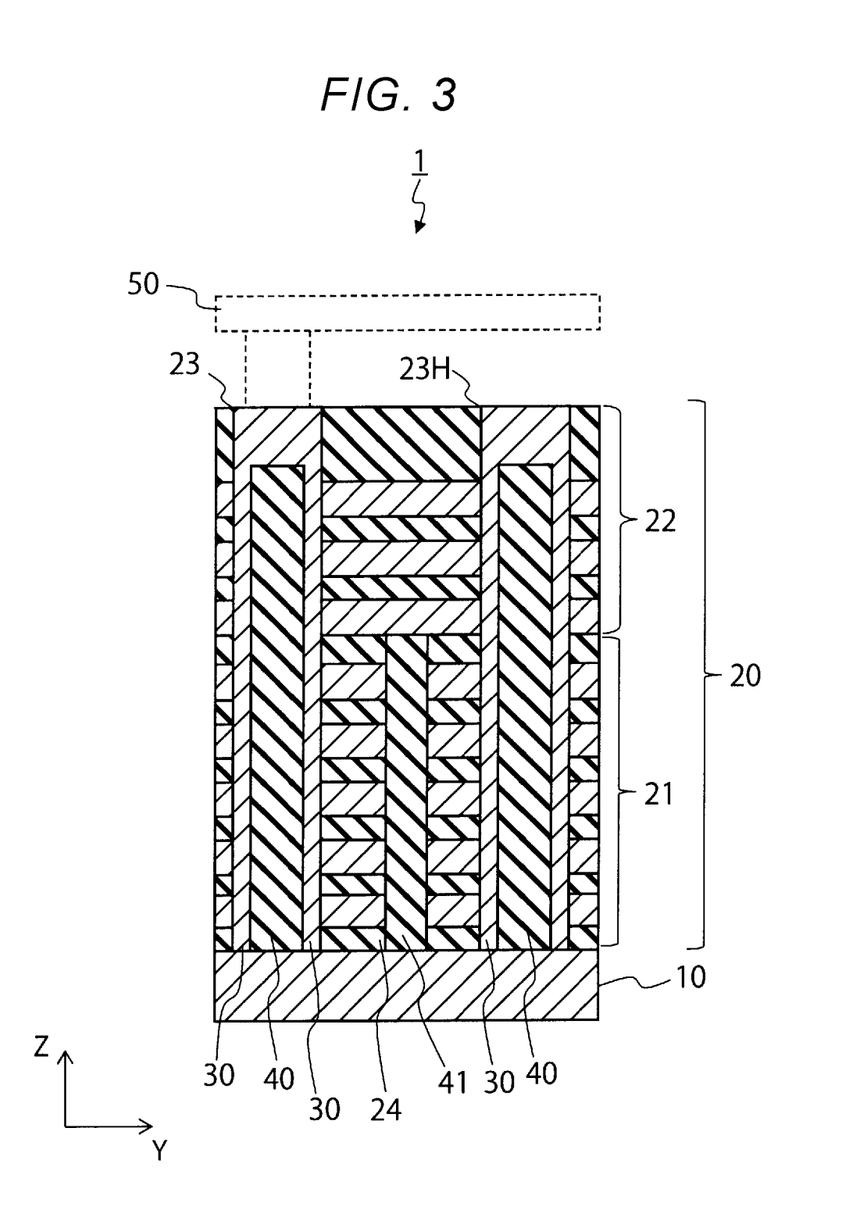
FIG. 3 is a sectional view taken along the cutting-plane line B-B depicted in FIG. 1.

FIG. 1 is a schematic plan view of a semiconductor memory device according to a first embodiment. FIG. 2 is a sectional view taken along the cutting-plane line A-A depicted in FIG. 1. FIG. 3 is a sectional view taken along the cutting-plane line B-B depicted in FIG. 1. As depicted in FIGS. 1 to 3, a semiconductor memory device 1 according to the present embodiment includes a semiconductor substrate 10 which is a silicon substrate, for example, a stacked body 20, and memory cell films 30.

The stacked body 20 has a first region 21 provided on the semiconductor substrate 10 and a second region 22 provided on the first region 21. In the first region 21, electrode layers (word lines) 121 and insulating layers 122, which extend parallel to an X direction, are alternately stacked in a Z direction perpendicular to the X direction. The Z direction is a direction perpendicular to the substrate. In the second region 22, selected gate electrode layers (selection gate electrode layers) (SGD) 221 and insulating layers 222, which are parallel to the X direction, are alternately stacked in the Z direction. The number of stacked electrode layers 121 and the number of stacked selected gate electrode layers 221 are not limited to particular numbers. FIG. 1 is a diagram showing the X-Y plane, which is viewed from above, of the selected gate electrode layer 221 depicted in FIGS. 2 and 3, and the electrode layer 121 and a first groove 24, which are located on the side closer to the substrate in the Z direction than the selected gate electrode layer 221, are indicated by broken lines. Moreover, the insulating layer 222 is not depicted in the drawing.

The electrode layers 121 and the selected gate electrode layers 221 are formed as conductive layers containing tungsten, for instance. The insulating layers 122 and the insulating layers 222 are formed as silicon oxide ($SiO_2$) layers, for instance. In the second region 22, a dummy word line (not depicted in the drawing) which does not function as an electrode layer may be provided below the selected gate electrode layer 221. The dummy word line is used to adjust a voltage between the electrode layers 121 and the selected gate electrode layers 221, for example.

In a hole 23 passing through the first region 21 and the second region 22, the memory cell films 30 face each other with an insulator 40 (a first insulator) which is silicon oxide, for example, placed therebetween or surround the insulator 40. The hole is surrounded by the second electrode, which is formed radially around the hole. That is, the second electrode is formed with an annular shape around the hole (i.e., a ring shape), so as to surround the hole in a radial direction. In the present embodiment, as depicted in FIG. 1, a plurality of holes 23 are arranged in a staggered manner in the X direction. An example of the structure of each memory cell film 30 will be briefly described with reference to FIG. 4.

Figure 4:
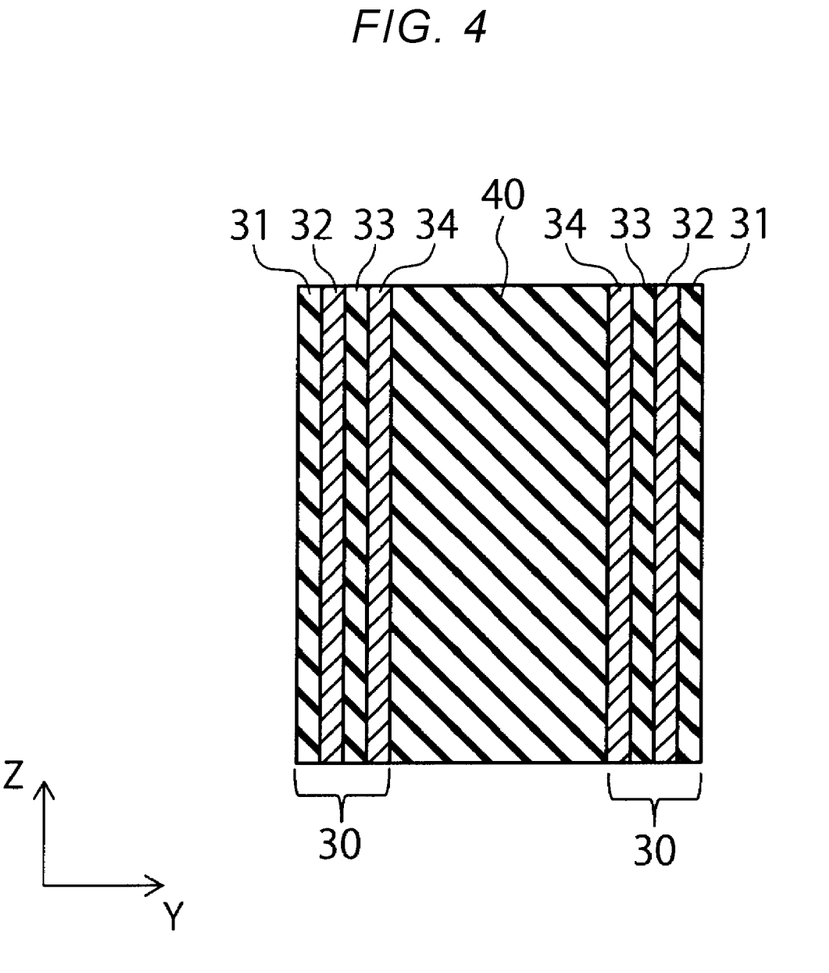
FIG. 4 is a sectional view depicting an example of the structure of a memory cell film.

FIG. 4 is a sectional view depicting an example of the structure of the memory cell film 30. In the present embodiment, the memory cell film 30 has a memory film including a charge block film 31, a charge storage film 32, and a tunnel insulating film 33 and a channel film (a semiconductor layer) 34. At each point of intersection of the channel film 34 and the electrode layers 121, a memory cell transistor including the tunnel insulating film 33, the charge storage film 32, and the charge block film 31 is formed. In FIGS. 2 and 3, the memory film and the channel film 34 are collectively depicted as the memory cell film 30.

Representative materials are discussed below by way of example. The charge block film 31 and the tunnel insulating film 33 may be formed as silicon oxide films, for instance. The charge storage film 32 may be formed as a silicon nitride (SiN) film, for example. The channel film 34 may be formed as a polysilicon film, for instance. The channel film 34 is connected to a bit line 50 (see FIGS. 2 and 3) extending in a Y direction.

As depicted in FIGS. 1 to 3, in the first region 21, the electrode layers 121 are divided by the first groove 24 extending in the X direction. In the first groove 24, an insulator 41 which is silicon oxide, for example, is embedded. That is, in the Y direction, an electrode 121a and an electrode 121b are formed via a first groove 24a. Moreover, there may be a plurality of first grooves 24. For instance, the electrode 121b and an electrode 121c may be formed via a first groove 24b provided parallel to the first groove 24a in the X direction.

The electrode 121a and the electrode 121c are electrically connected. The electrode 121a and the electrode 121b are not electrically connected. The electrode 121b and the electrode 121c are not electrically connected. That is, each hole 23 has a memory cell transistor for each of the two electrodes which face each other. A memory cell transistor formation region is treated as a memory unit (a memory).

On the other hand, in the second region 22, the selected gate electrode layers 221 are not divided by the first grooves 24a and 24b, and the electrodes are continuous. In other words, in the X-Y plane intersecting the electrode layers 221, the holes 23 are surrounded with the electrode layers 221. That is, the outer periphery of the memory cell film 30 faces the electrode layers 221.

The selected gate electrode layers 221 have a second groove 25 that divides the selected gate electrode layers 221 by extending in the X direction. In the second groove 25, an insulator 42 which is silicon oxide, for example, is embedded. As a result, in FIG. 1, for instance, the selected gate electrode layers 221 include selected gate electrode layers 221a and 221b divided by the second groove 25. The selected gate electrode layers 221a and 221b are electrically insulated from each other by the second groove 25. As depicted in FIG. 3, a hole 23H provided in a position in which the hole 23H passes through the second groove 25 is not connected to the bit line 50. That is, the hole 23H formed in the second groove 25 is a dummy memory cell transistor.

In other words, the structure depicted in FIGS. 1 to 3 has a stacked body 21a including the electrode 121a and formed of the layers stacked in the Z direction, a stacked body 21b including the electrode 121b and formed of the layers stacked in the Z direction, a stacked body 21c including the electrode 121c and formed of the layers stacked in the Z direction, and a stacked body 22a provided over these stacked bodies 21a, 21b, and 21c and having the same width as that of the stacked bodies 21a, 21b, and 21c in the Y direction.

Hereinafter, certain production processes of the semiconductor memory device 1 according to some embodiments will be described with reference to FIGS. 5 to 11.

Figure 5:
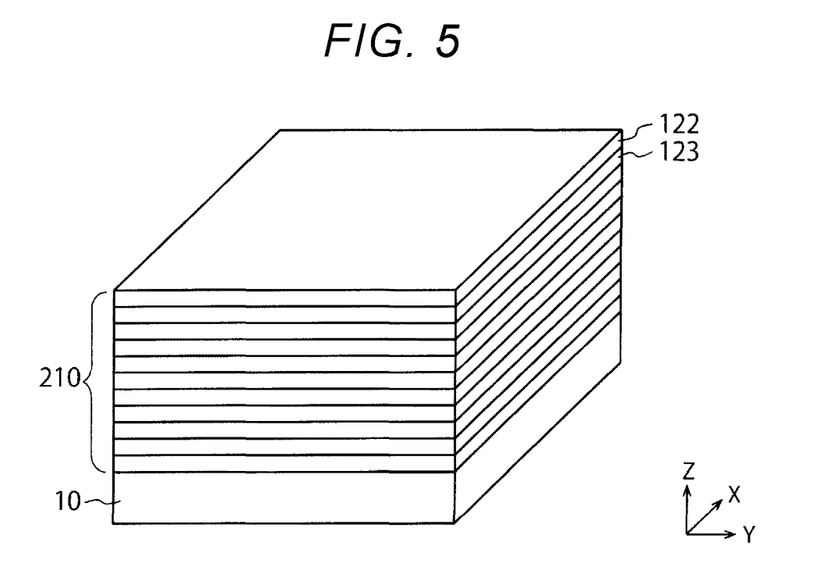
FIG. 5 is a perspective view depicting a process of forming a stacked body.

First, as depicted in FIG. 5, a stacked body 210 is formed on the semiconductor substrate 10. The stacked body 210 corresponds to the above-described first region 21 of the stacked body 20. In the stacked body 210, insulating layers 123 and the insulating layers 122 are alternately stacked. The insulating layers 123 are formed as silicon nitride layers, for example. An under layer may be provided between the semiconductor substrate 10 and the stacked body 210. As an example of the under layer, a cell source line or the like is possible.

Figure 6:
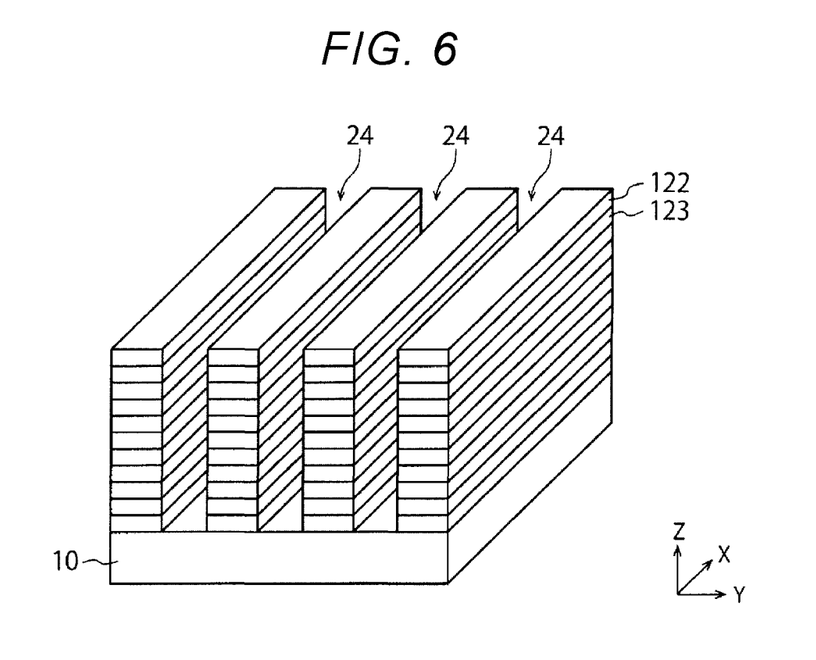
FIG. 6 is a perspective view depicting a process of forming first grooves in the stacked body.
Figure 7:
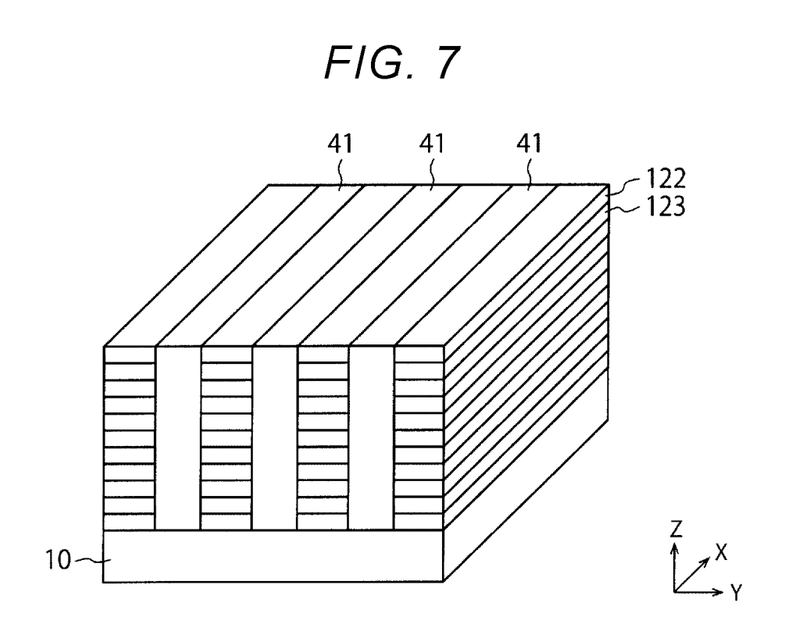
FIG. 7 is a perspective view depicting a process of embedding an insulator in the first grooves.

Next, as depicted in FIG. 6, a plurality of first grooves 24 extending parallel to the X direction are formed. As a result, the stacked body 210 is divided. Then, as depicted in FIG. 7, the insulator 41 is embedded in the first grooves 24.

Figure 8:
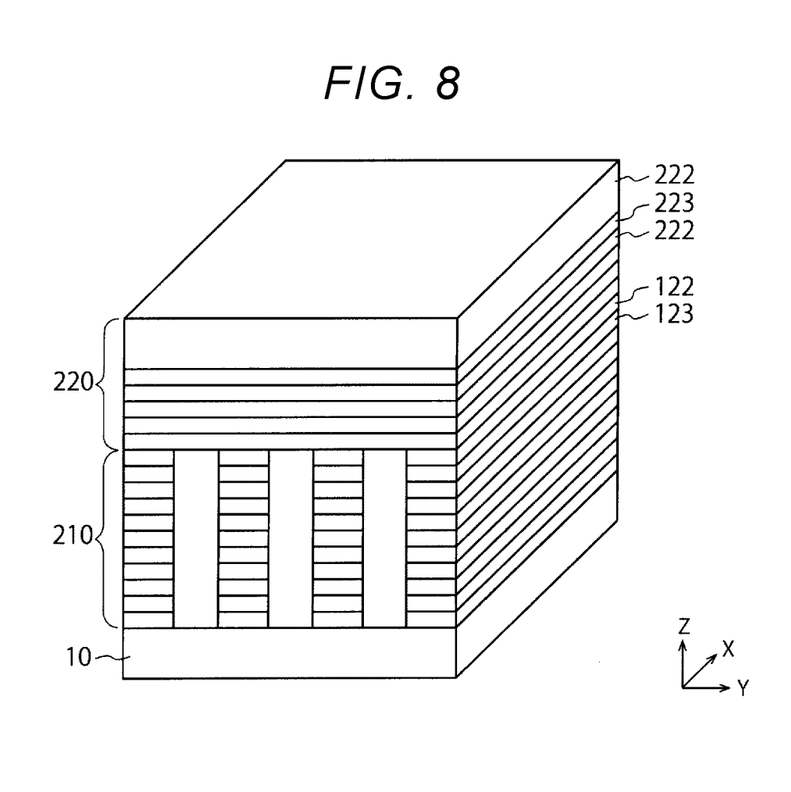
FIG. 8 is a perspective view depicting a process of forming another stacked body on the stacked body.

Next, as depicted in FIG. 8, a stacked body 220 is formed on the stacked body 210. The stacked body 220 corresponds to the above-described second region 22 of the stacked body 20. In the stacked body 220, insulating layers 223 and the insulating layers 222 are alternately stacked. The insulating layers 223 are formed as silicon nitride layers, for example.

Figure 9:
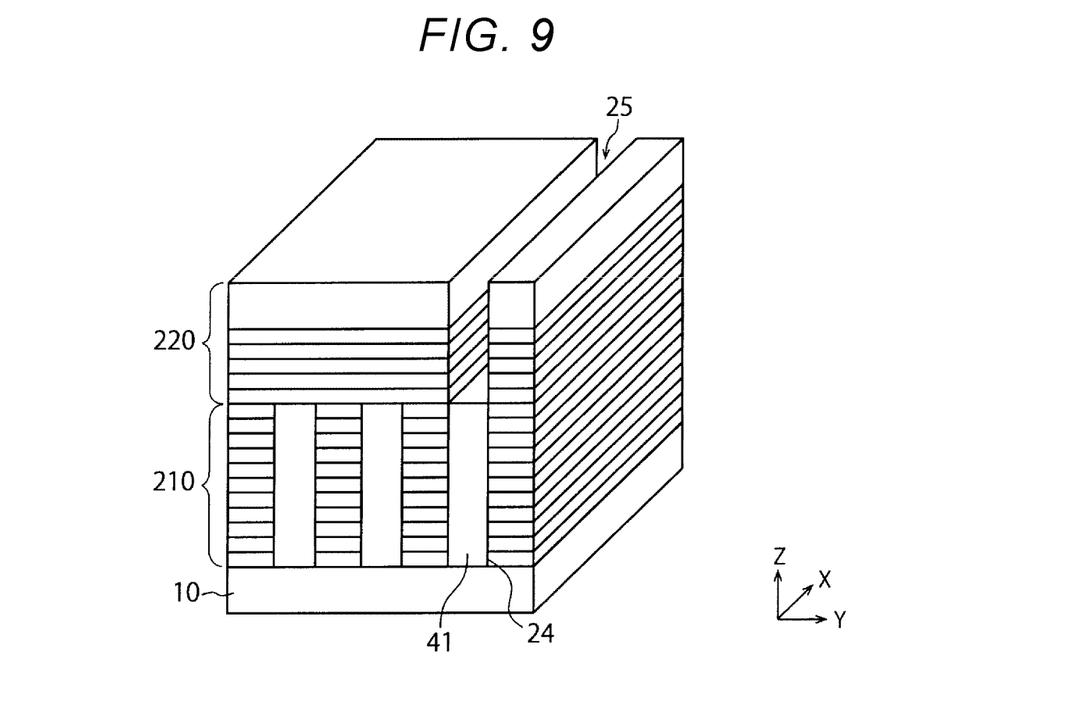
FIG. 9 is a perspective view depicting a process of forming a second groove in the other stacked body.

Then, as depicted in FIG. 9, the second groove 25 extending parallel to the X direction is formed. As a result, part of the stacked body 220 is divided. The second groove 25 is formed on the first groove 24, for example.

Figure 10:
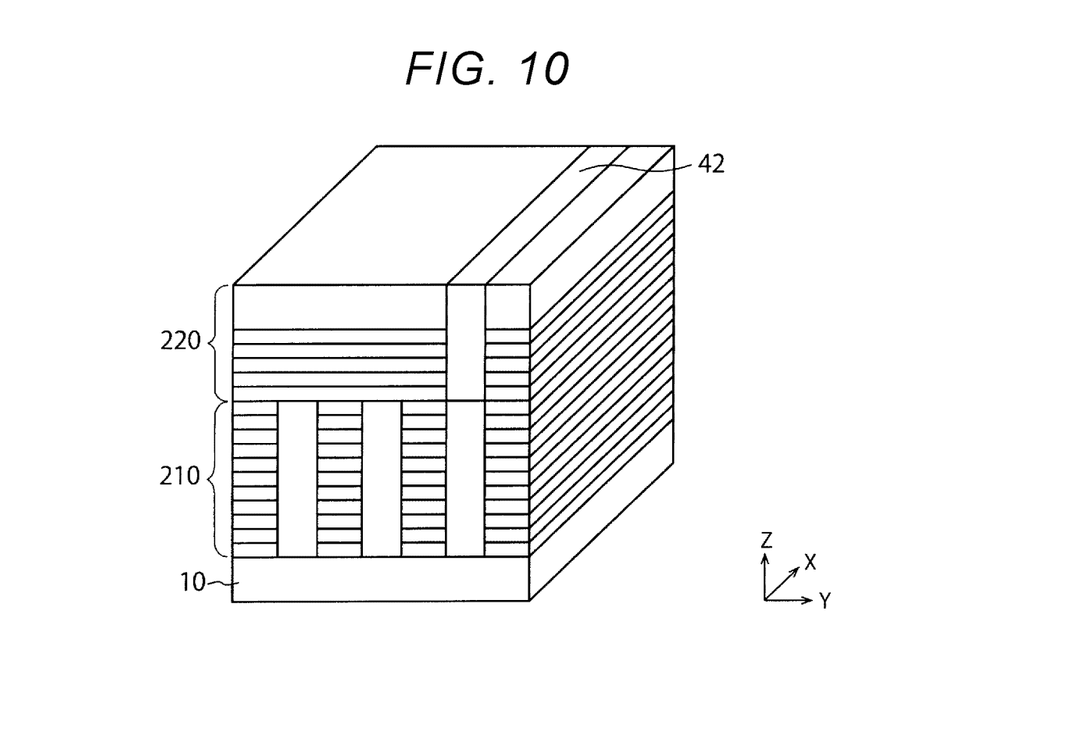
FIG. 10 is a perspective view depicting a process of embedding an insulator in the second groove.
Figure 11:
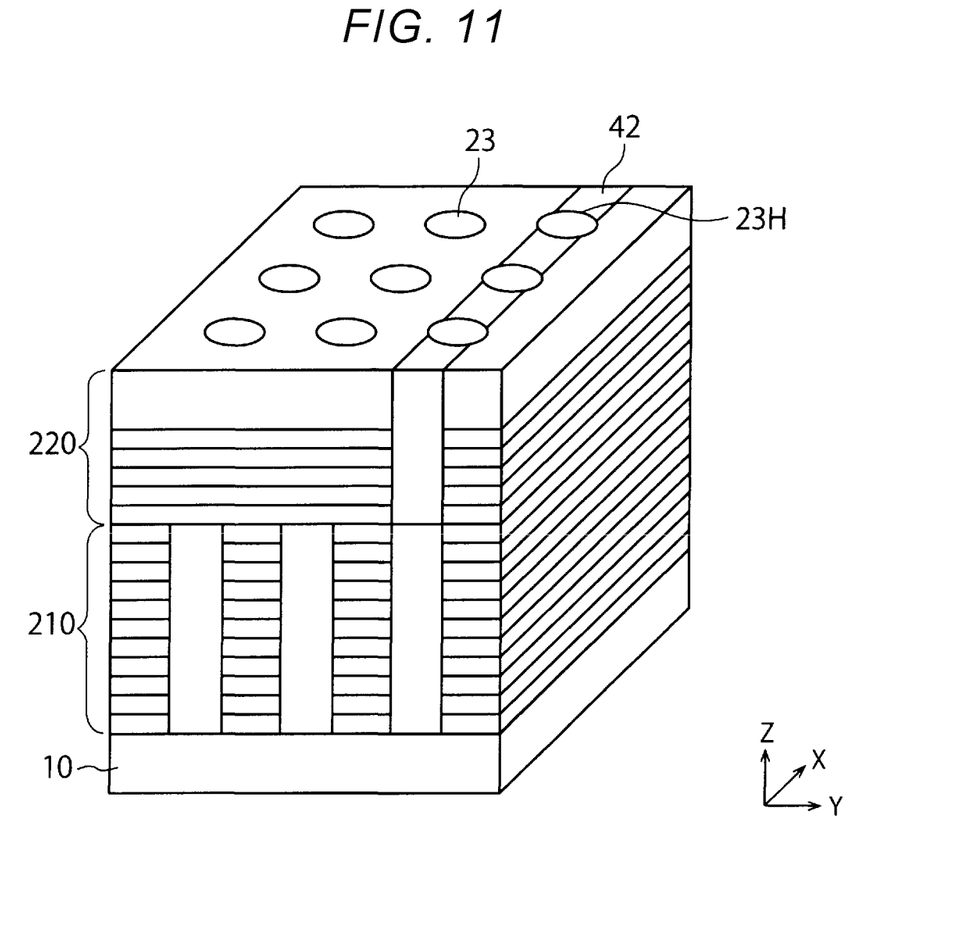
FIG. 11 is a perspective view depicting a process of forming holes in the two stacked bodies.

Next, as depicted in FIG. 10, the insulator 42 is embedded in the second groove 25. Then, the holes 23 and 23H are formed as depicted in FIG. 11. At this time, the holes are formed so as to be aligned such that the holes pass through the insulator 41 embedded in the first grooves 24 of the stacked body 210 in the Z direction. That is, some holes 23 (the holes 23H) are formed so as to pass through both the insulator 41 embedded in the first grooves 24 and the insulator 42 embedded in the second groove 25. Then, the memory cell films 30 are formed in the holes 23 and 23H.

Then, an opening (not depicted in the drawing), which is different from the holes 23, and passing through the stacked body 210 and the stacked body 220, is formed. By using this opening, the insulating layers 123 are replaced with the electrode layers 121 and the insulating layers 223 are replaced with the selected gate electrode layers 221. In this way, the semiconductor memory device 1 according to some embodiments is produced. In the replacing process, the opening may have the shape of a hole or the shape of a slit that divides the stacked body.

The selected gate electrode layers 221 are required to have high characteristics about on and off because the selected gate electrode layers 221 select the memory cell films 30 in operation units (i.e., the selection cells) at the time of writing and reading. Thus, if the selected gate electrode layers 221 provided in the same operation region are divided, a leakage current flowing through the division area may result in deterioration of the cutoff characteristics of a non-selected region. In this case, there is a possibility that a boost voltage of the non-selected region is reduced, leading to a reduction in product performance and a reduction in reliability such as the erasure of write data.

However, according to some embodiments as described above, a division part by the first groove 24 is not present in the selected gate electrode layers 221 whose operation units are the same. Thus, generation of the above-described leakage current can be avoided, and therefore product performance and reliability can be improved. Further, in some embodiments, the operation unit is, for example, a write unit (a page unit). In some embodiments, each of the selected gate electrode layers 221a and 221b generated as a result of division by the second groove 25 is the operation unit. The number of electrode layers 121 configuring the operation unit, the number of first grooves 24, and the number of bit lines 50 are not limited to any particular quantities.

Second Embodiment

Figure 12:
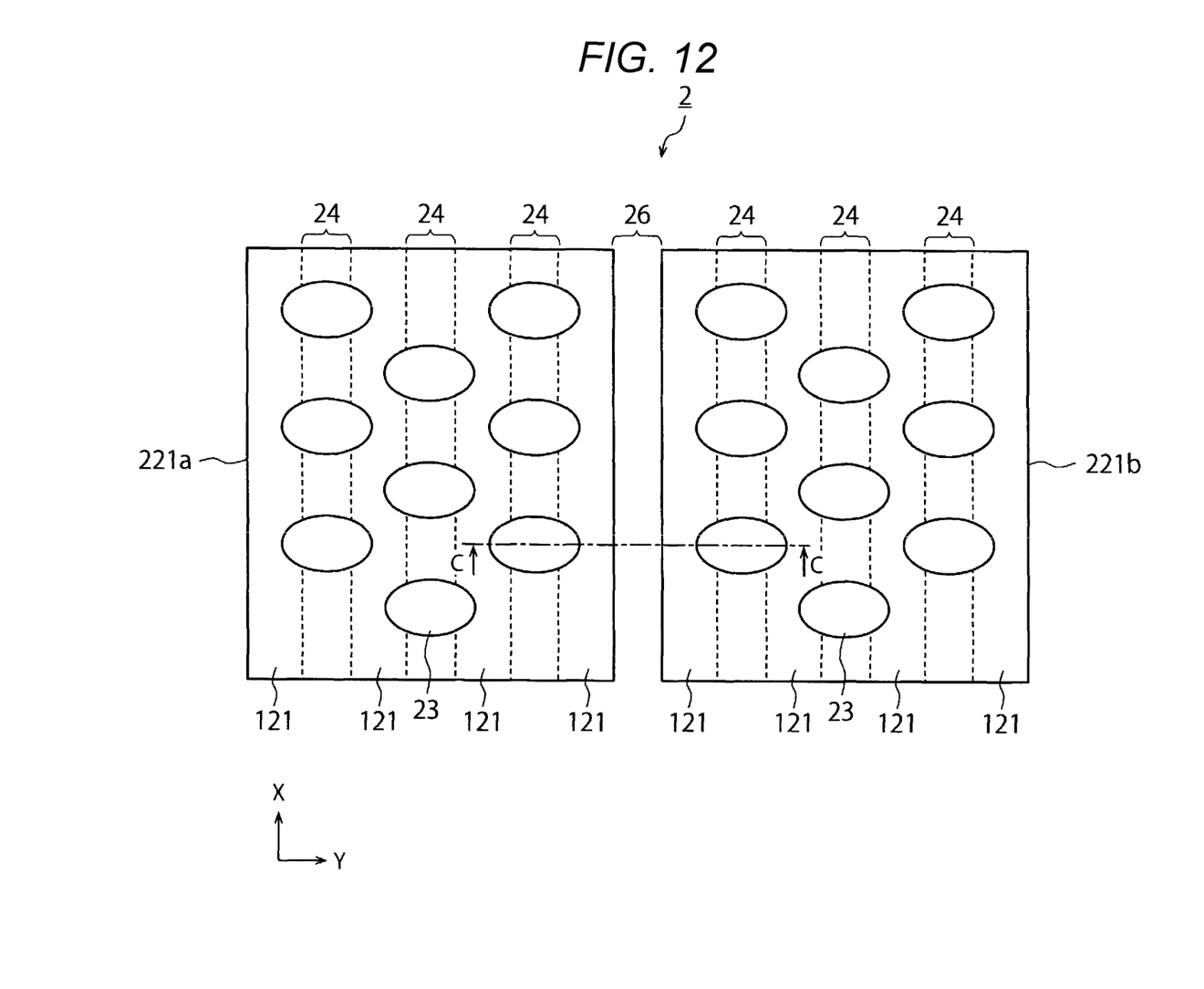
FIG. 12 is a schematic plan view of a semiconductor memory device according to a second embodiment.
Figure 13:
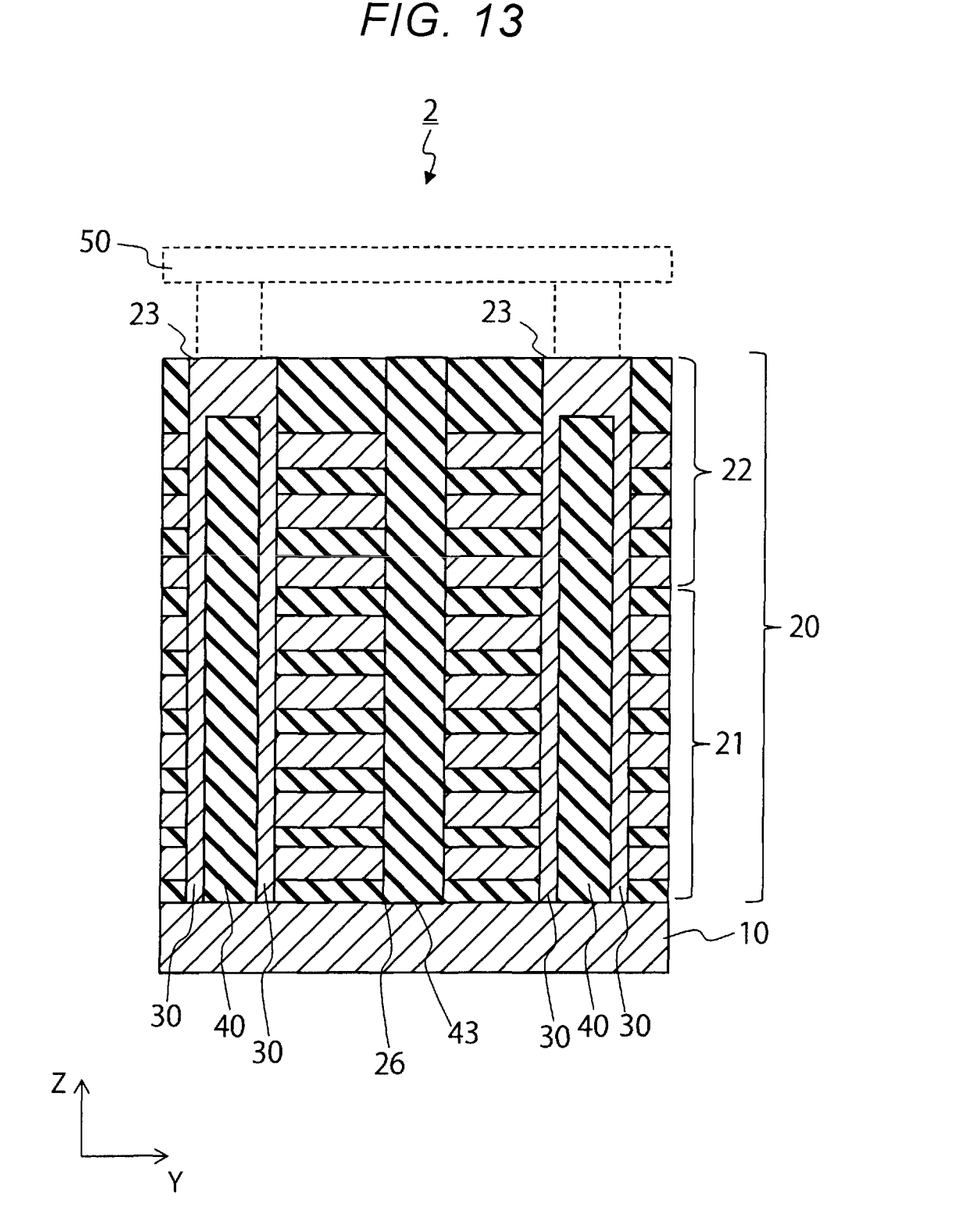
FIG. 13 is a sectional view taken along the cutting-plane line C-C depicted in FIG. 12.

FIG. 12 is a schematic plan view of a semiconductor memory device according to a second embodiment. FIG. 13 is a sectional view taken along the cutting-plane line C-C depicted in FIG. 12. In FIGS. 12 and 13, component elements similar to those of the above-described first embodiment will be identified with the same reference signs and the detailed description thereof will be omitted. FIG. 12 is a diagram showing the X-Y plane, which is viewed from above, of the selected gate electrode layer 221 depicted in FIG. 13, and the electrode layer 121 and the first grooves 24, which are located on the side closer to the substrate in the Z direction than the selected gate electrode layer 221, are indicated by broken lines. Moreover, the insulating layer 222 is not depicted in the drawing.

In the above-described first embodiment, the second groove 25 that divides the selected gate electrode layers 221 is formed in the position in which the holes 23H are formed in the second region 22 of the stacked body 20.

In a semiconductor memory device 2 according to the present embodiment, a slit 26 that divides the stacked body 20 is formed in a position which is different from the positions in which the holes 23 are formed. The slit 26 is provided in any position that divides the operation units, for example. In FIG. 12, the selected gate electrode layers 221a and 221b are formed via the slit 26. The selected gate electrode layers 221a and 221b are electrically insulated from each other. In the slit 26, an insulator 43 (a fourth insulator) which is silicon oxide, for instance, is embedded. This slit 26 is formed, in a position different from the positions in which the first grooves 24 are formed, as a through groove passing through the stacked bodies after the process (see FIG. 8) described in the first embodiment by which the stacked body 22a is formed on the stacked body 21a. As in the case of the first embodiment, the hole 23H having a dummy memory cell transistor may be formed in the position in which the slit 26 is formed.

According to the present embodiment described above, the selected gate electrode layers 221 whose operation units are the same are continuous without being divided. As a result, as in the case of the first embodiment, product performance and reliability can be improved. Moreover, in the present embodiment, the slit 26 is formed at the boundary of the operation units in one operation. Thus, as compared to the first embodiment in which the first grooves 24 and the second groove 25 are formed in separate processes, the production process can be shortened.

Modification

Figure 14:
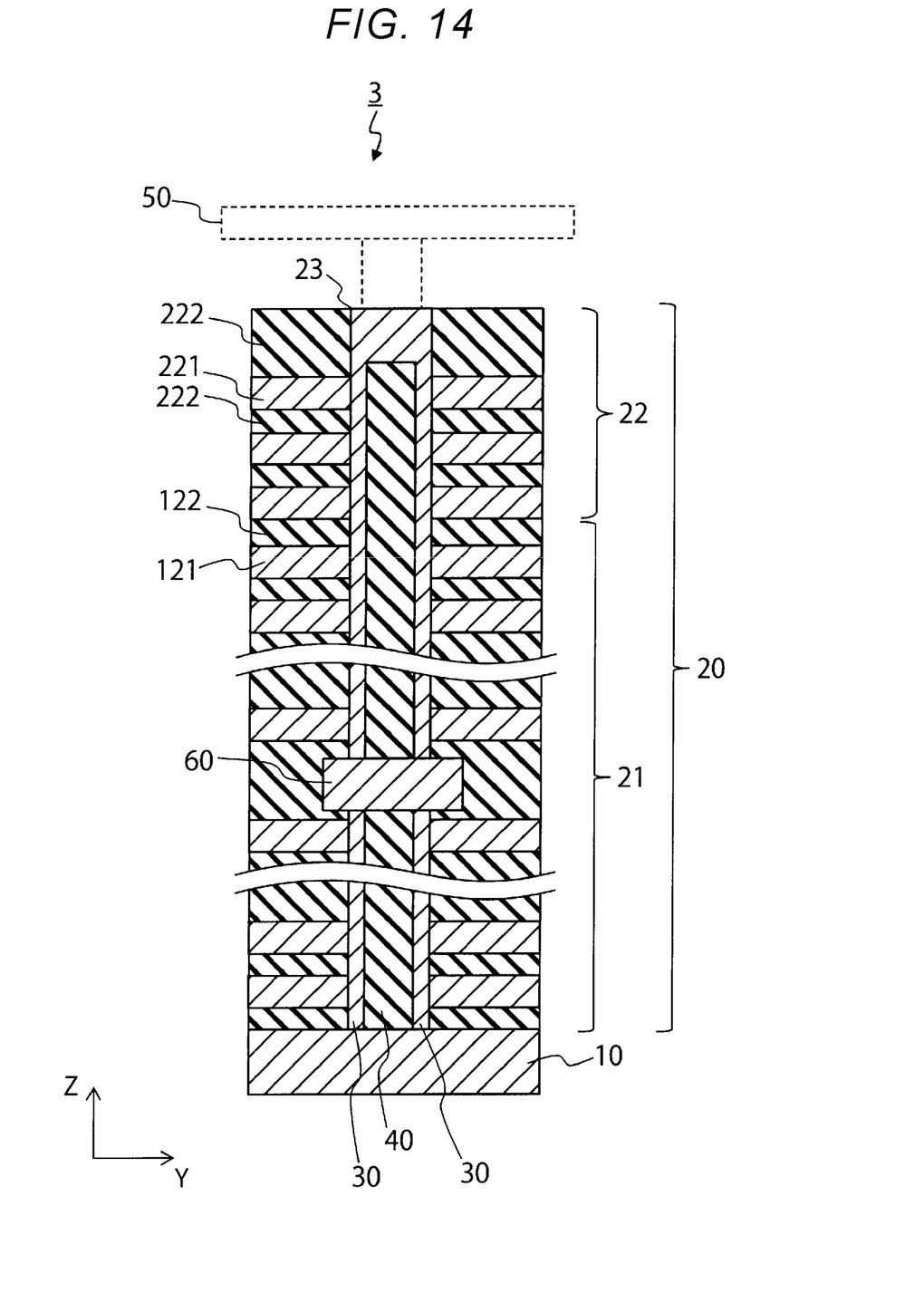
FIG. 14 is a sectional view of principal portions of a semiconductor memory device according to some embodiments.

FIG. 14 is a sectional view depicting the structure of principal portions of a semiconductor memory device according to some embodiments. Component elements similar to those of the above-described first embodiment will be identified with the same reference signs and the detailed description thereof will be omitted. A semiconductor memory device 3 according to this modification includes a lower layer stacked body and an upper layer stacked body which are divided parts of the first region 21 of the stacked body 20. A stopper 60 is provided between the lower layer stacked body and the upper layer stacked body. The lower layer stacked body is located, in the Z direction, on the side where the substrate is located, and the upper layer stacked body is located on the lower layer stacked body. The lower layer stacked body and the upper layer stacked body have an equal number of stacked layers, for example, but the number of stacked layers is not limited to a particular number.

When a large number of electrode layers 121 are provided in the first region 21 with an increase in storage capacity, formation of a deep hole 23 becomes necessary. In this case, processing to form the hole 23 is difficult. Thus, for example, a hole is first formed in the lower layer stacked body, the stopper 60 and the upper layer stacked body are then formed on the lower layer stacked body, and a hole is formed in the upper layer stacked body. In this way, the hole 23 is formed in stages. At this time, by placing the stopper 60 between the holes, the stopper 60 functions as an etching stopper film. The stopper 60 is formed as a polysilicon film, for example. Since the stopper 60 is formed of polysilicon, the channel film 34 of the lower layer stacked body and the channel film 34 of the upper layer stacked body are electrically connected to each other. Moreover, since the hole is formed in stages, there may be a slight difference between the hole position in the lower layer stacked body and the hole position in the upper layer stacked body. The number of stages for formation of the hole is not limited to two, and the hole may be formed in three or more stages.

Next, a method for producing the semiconductor memory device according to some embodiments is described. First, a first production method is described.

When the structure of the modification is applied to the first embodiment, first, the first groove 24 in which the insulator is embedded and the hole 23 passing through the groove are formed in the lower layer stacked body, and the memory cell films 30 are formed in the hole 23. Then, the stopper 60 and the upper layer stacked body are formed on the lower layer stacked body, and the first groove 24 in which the insulator is embedded is formed so as to be located in almost the same position as the first groove 24 formed in the lower layer stacked body. Then, the second region 22 of the stacked body is formed on the upper layer stacked body, and the following is the same as the method of the first embodiment depicted in FIG. 9 and the drawings that follow.

When the structure of the modification is applied to the second embodiment, the first groove 24 in which the insulator is embedded and the hole 23 passing through the groove are first formed in the lower layer stacked body, and the memory cell films 30 are formed in the hole 23. Then, the stopper 60 and the upper layer stacked body are formed on the lower layer stacked body. Then, the first groove 24 in which the insulator is embedded is formed in a manner similar to the second embodiment, and the second region 22 of the stacked body is formed on the upper layer stacked body. A hole that passes through the upper layer stacked body and the second region 22 is formed, and the slit 26 that divides the lower layer, the upper layer, and the stacked body of the second region 22 is then formed.

Next, a second production method will be described. When the structure of the modification is applied to the first embodiment, after the formation of the first groove 24 in which the insulator is embedded and the hole 23 in the lower layer stacked body, a sacrificial layer which is different from the material of the first groove 24 is embedded in the hole 23. The sacrificial layer is a silicon nitride layer, for example. Then, the upper layer stacked body is formed, and the first groove 24 is formed in the upper layer stacked body. The first groove 24 which is formed in the upper layer stacked body is aligned so as to be located in the same position, in the Z direction, as the first groove 24 formed in the lower layer stacked body. Then, by the method depicted in FIG. 9 and the drawings that follow, the second groove 25 and the hole 23 are formed. At this time, the lower end of the hole 23 formed in the upper layer stacked body reaches the sacrificial layer embedded in the hole 23 of the lower layer stacked body. An opening which is different from the hole 23 is formed, and the silicon nitride layers forming the stacked body and the sacrificial layer embedded in the hole 23 of the lower layer stacked body are removed. Then, the memory cell films are formed, in one operation, in the hole 23 passing through the lower layer stacked body, the upper layer stacked body, and the second region 22.

Also when the structure of the modification is applied to the second embodiment, a sacrificial layer is embedded in the hole 23 passing through the lower layer stacked body, the upper layer stacked body and the second region 22 are formed, and the hole 23 is formed therein so as to reach the sacrificial layer. The sacrificial layer is removed from the slit 26, and the memory cell films are formed, in one operation, in the hole 23 passing through the lower layer stacked body, the upper layer stacked body, and the second region 22.

Also in this modification, as in the case of the first and second embodiments, the selected gate electrode layers 221 whose operation units are the same are continuous without being divided by the first groove 24. As a result, even when the number of electrode layers 121 is increased, product performance and reliability can be improved.

While certain embodiments have been described, these embodiments have been presented by way of example only, and are not intended to limit the scope of the inventions. Indeed, the novel embodiments described herein may be embodied in a variety of other forms; furthermore, various omissions, substitutions and changes in the form of the embodiments described herein may be made without departing from the spirit of the inventions. The accompanying claims and their equivalents are intended to cover such forms or modifications as would fall within the scope and spirit of the inventions.

What is claimed is:

1. A semiconductor memory device comprising:
   a substrate;
   a stacked body provided on the substrate, the stacked body comprising a first stacked body formed of a plurality of stacked first electrode layers and a second stacked body provided on the first stacked body, the second stacked body including at least one second electrode layer;
   a hole that passes through the first stacked body and the second stacked body in a first direction perpendicular to the substrate and has a first insulator;
   a semiconductor layer that is located between the first insulator and the first electrode layers and between the first insulator and the second electrode layer, the channel film having a first portion and a second portion which face each other, with the first insulator placed therebetween;
   a first memory located between the first electrode layers and the first portion, and a second memory located between the first electrode layers and the second portion, the first memory and the second memory being electrically insulated from each other; and
   a third memory located between the second electrode layer and the first portion and a fourth memory located between the second electrode layer and the second portion, the third memory and the fourth memory being electrically connected to each other.

2. The semiconductor memory device according to claim 1, further comprising:
   a second insulator provided in a position different from a position of the first insulator and which divides the stacked body in the first direction.

3. The semiconductor memory device according to claim 2, further comprising:
   a dummy memory cell positioned between the second insulator and the first electrode layers and between the second insulator and the second electrode layer.

4. The semiconductor memory device according to claim 1, wherein
   the first to fourth memories include a memory film.

5. The semiconductor memory device according to claim 1, wherein
   the first stacked body further comprises a stopper film including a polysilicon layer sandwiched between insulating layers.

6. The semiconductor memory device according to claim 1, wherein the third memory and the fourth memory are selection cells.

7. A semiconductor memory device comprising:
   a substrate;
   a stacked body provided on the substrate and includes a first stacked body which is formed of a plurality of stacked first electrode layers, and a second stacked body provided on the first stacked body and including at least one second electrode layer;
   a hole that passes through the first stacked body and the second stacked body in a first direction perpendicular to the substrate, the hole having a first insulator; and
   a semiconductor layer located between the first insulator and the first electrode layers and between the first insulator and the second electrode layer and having a first portion and a second portion which face each other, with the first insulator placed therebetween,
   wherein the first electrode layers are divided to sandwich the hole therebetween and the second electrode layer is provided radially around the hole.

8. The semiconductor memory device according to claim 7, further comprising:
   a second insulator provided in a position different from a position of the first insulator and which divides the stacked body in the first direction.

9. The semiconductor memory device according to claim 8, further comprising a dummy memory cell between the second insulator and the first electrode layers and between the second insulator and the second electrode layer.

10. The semiconductor memory device according to claim 7, further comprising:
a first memory located between the first electrode layers and the first portion and a second memory located between the first electrode layers and the second portion.

11. The semiconductor memory device according to claim 10, wherein the first memory and the second memory include a memory film.

12. The semiconductor memory device according to claim 7, wherein the first stacked body further comprises a stopper film including a polysilicon layer sandwiched between insulating layers.

13. The semiconductor memory device according to claim 7, wherein the first electrode layer constitutes a word line and the second electrode layer constitutes a selection gate.

14. A semiconductor memory device, comprising:
a substrate;
a first stacked body provided on the substrate, the first stacked body being formed of a plurality of first electrode layers;
a second stacked body provided on the substrate, the second stacked body being formed of a plurality of second electrode layers, the plurality of second electrode layers being electrically insulated from the first electrode layers by a first insulating layer provided between the first stacked body and the second stacked body;
a third stacked body provided on the first stacked body, the first insulating layer and the second stacked body, the third stacked body being formed of at least one third electrode layer; and
a semiconductor layer passing through the third stacked body and the first insulating layer in a first direction perpendicular to the substrate.

15. The semiconductor memory device according to claim 14, wherein a quantity of the first electrode layers and a quantity of the second electrode layers is the same.

16. The semiconductor memory device according to claim 14, wherein a second insulating layer passes through the first stacked body and the third stacked body in a first direction perpendicular to the substrate and has a first insulator.

\* \* \* \* \*